US012768075B2

(12) United States Patent
Markham et al.

(10) Patent No.: US 12,768,075 B2
(45) Date of Patent: Oct. 20, 2026

(54) SINGLE CRYSTAL DIAMOND COMPONENT AND METHOD FOR PRODUCING

(71) Applicant: Element Six Technologies Limited, Oxfordshire (GB)

(72) Inventors: Matthew Lee Markham, Oxfordshire (GB); Jonathan Christopher Newland, Oxfordshire (GB)

(73) Assignee: Element Six Technologies Limited, Oxfordshire (GB)

( * ) Notice: Subject to any disclaimer, the term of this patent is extended or adjusted under 35 U.S.C. 154(b) by 299 days.

(21) Appl. No.: 18/576,900

(22) PCT Filed: Jul. 5, 2022

(86) PCT No.: PCT/EP2022/068565
§ 371 (c)(1),
(2) Date: Jan. 5, 2024

(87) PCT Pub. No.: WO2023/280842
PCT Pub. Date: Jan. 12, 2023

(65) Prior Publication Data
US 2024/0309554 A1 Sep. 19, 2024

(30) Foreign Application Priority Data
Jul. 6, 2021 (GB) ...................................... 2109750

(51) Int. Cl.

| | |
|---|---|
| ***C30B 29/04*** | (2006.01) |
| ***C30B 31/22*** | (2006.01) |
| ***C30B 33/02*** | (2006.01) |
| ***C30B 33/04*** | (2006.01) |
| ***C30B 33/10*** | (2006.01) |

(52) U.S. Cl.
CPC .............. *C30B 29/04* (2013.01); *C30B 31/22* (2013.01); *C30B 33/02* (2013.01); *C30B 33/04* (2013.01); *C30B 33/10* (2013.01)

(58) Field of Classification Search
CPC ......... C30B 29/04; C30B 31/22; C30B 33/04; C30B 33/02; C30B 33/10
See application file for complete search history.

(56) References Cited

U.S. PATENT DOCUMENTS

2021/0148005 A1 5/2021 Noguchi et al.

FOREIGN PATENT DOCUMENTS

CN 110835741 A 2/2020
GB 2483767 A 3/2012
(Continued)

OTHER PUBLICATIONS

Mildren, Rich P. et al., "Refractive and Diffractive Diamond Optics," Chapter 4, p. 130, Optical Engineering of Diamond, Wiley-VCH 2013.

(Continued)

*Primary Examiner* — Robert M Kunemund
(74) *Attorney, Agent, or Firm* — Armstrong Teasdale LLP

(57) ABSTRACT

A single crystal CVD diamond component and a method of fabricating the single crystal CVD diamond component. The single crystal CVD diamond component comprises a surface, wherein at least a portion of the surface has been processed by chemical mechanical polishing, CMP, and a layer of quantum spin defects, said layer of quantum spin defects being disposed within 500 nm of the surface.

20 Claims, 3 Drawing Sheets

(56) References Cited

FOREIGN PATENT DOCUMENTS

| | | | | | |
|---|---|---|---|---|---|
| GB | 2490589 | A | | 11/2012 | |
| GB | 2495632 | A | * | 4/2013 | ........... H10D 62/814 |
| GB | 2528638 | A | * | 2/2016 | ............... B24D 3/28 |
| GB | 2570583 | A | * | 7/2019 | ............. C30B 33/12 |
| WO | 2001096633 | A1 | | 12/2001 | |
| WO | 2010010344 | A1 | | 1/2010 | |
| WO | WO-2010010352 | A1 | * | 1/2010 | ............. C30B 31/22 |
| WO | 2012152617 | A1 | | 11/2012 | |
| WO | 2012152685 | A1 | | 11/2012 | |
| WO | 2012159896 | A1 | | 11/2012 | |
| WO | 2014090662 | A1 | | 6/2014 | |
| WO | WO-2015071487 | A1 | * | 5/2015 | ......... H10D 62/8303 |

OTHER PUBLICATIONS

Sangtawesin, Sorawis et al., "Origins of Diamond Durface Noise Probed by Correlating Single-Spin Measurements with Surface Spectroscopy," Physical Review X 9(3): 031052(17), 2018.

Braunbeck, G. et al. "Effect of ultraprecision polishing techniques on coherence times of shallow nitrogen-vacancy centers in diamond," Diamond & Related Materials 85: 18-22 (2018).

Combined Search and Examination Report issued for GB2109750.6, dated Dec. 31, 2021 (7 pages).

International Search Report and Written Opinion issued for PCT/EP2022/068565, dated Sep. 16, 2022 (14 pages).

* cited by examiner

SINGLE CRYSTAL DIAMOND COMPONENT AND METHOD FOR PRODUCING

CROSS-REFERENCE TO RELATED APPLICATIONS

This application is a § 371 national stage of International Application No. PCT/EP2022/068565, filed Jul. 5, 2022, which claims priority to Great Britain Application No. 2109750.6, filed Jul. 6, 2021.

FIELD OF THE INVENTION

This disclosure relates to a single crystal diamond components, in particular those that include quantum spin defects, and methods for producing the same.

BACKGROUND

Point defects in synthetic diamond material, particularly quantum spin defects and/or optically active defects, have been proposed for use in various imaging, sensing, and processing applications including: luminescent tags; magnetometers; spin resonance devices such as nuclear magnetic resonance (NMR) and electron spin resonance (ESR) devices; spin resonance imaging devices for magnetic resonance imaging (MRI); and quantum information processing devices such as for quantum communication and computing.

Many point defects have been studied in synthetic diamond material including: silicon containing defects such as silicon-vacancy defects (Si—V), silicon di-vacancy defects (Si—$V_2$), silicon-vacancy-hydrogen defects (Si—V:H), silicon di-vacancy hydrogen defects (S—$V_2$:H); nickel containing defect; chromium containing defects; and nitrogen containing defects such as nitrogen-vacancy defects (N—V), di-nitrogen vacancy defects (N—V—N), and nitrogen-vacancy-hydrogen defects (N—V—H). These defects are typically found in a neutral charge state or in a negative charge state. It will be noted that these point defects extend over more than one crystal lattice point. The term point defect as used herein is intended to encompass such defects but not include larger cluster defects, such as those extending over ten or more lattice points, or extended defects such as dislocations which may extend over many lattice points.

It has been found that certain defects are particularly useful for sensing and quantum processing applications when in their negative charge state. For example, the negatively charged nitrogen-vacancy defect ($NV^-$) in synthetic diamond material has attracted a lot of interest as a useful quantum spin defect because it has several desirable features including:

(i) Its electron spin states can be coherently manipulated with high fidelity and have an extremely long coherence time (which may be quantified and compared using the transverse relaxation time $T_2$ and/or $T_2$*);

(ii) Its electronic structure allows the defect to be optically pumped into its electronic ground state allowing such defects to be placed into a specific electronic spin state even at non-cryogenic temperatures. This can negate the requirement for expensive and bulky cryogenic cooling apparatus for certain applications where miniaturization is desired. Furthermore, the defect can function as a source of photons which all have the same spin state; and (iii) Its electronic structure comprises emissive and non-emissive electron spin states which allows the electron spin state of the defect to be read out through photons.

This is convenient for reading out information from synthetic diamond material used in sensing applications such as magnetometry, spin resonance spectroscopy, and imaging. Furthermore, it is a key ingredient towards using the $NV^-$ defects as qubits for long-distance quantum communications and scalable quantum computation. Such results make the $NV^-$ defect a competitive candidate for solid-state quantum information processing (QIP).

The $NV^-$ defect in diamond consists of a substitutional nitrogen atom adjacent to a carbon vacancy. Its two unpaired electrons form a spin triplet in the electronic ground state (3A), the degenerate ms=±1 sublevels being separated from the ms=0 level by 2.87 GHz. The electronic structure of the $NV^-$ defect is such that the ms=0 sublevel exhibits a high fluorescence rate when optically pumped. In contrast, when the defect is excited in the ms=±1 levels, it exhibits a higher probability to cross over to the non-radiative singlet state ($^1A$) followed by a subsequent relaxation into ms=0. As a result, the spin state can be optically read out, the ms=0 state being "bright" and the ms=±1 states being dark. When an external magnetic field is applied, the degeneracy of the spin sublevels ms=±1 is broken via Zeeman splitting. This causes the resonance lines to split depending on the applied magnetic field magnitude and its direction. This dependency can be used for magnetometry by probing the resonant spin transitions using microwaves (MW) and using optically detected magnetic resonance (ODMR) spectroscopy to measure the magnitude and optionally direction of the applied magnetic field.

$NV^-$ defect in synthetic diamond material can be formed in a number of different ways including:

(i) formation during growth of the synthetic diamond material where a nitrogen atom and a vacancy are incorporated into the crystal lattice as a nitrogen-vacancy pair during growth;

(ii) formation after diamond material synthesis from native nitrogen and vacancy defects incorporated during the growth process by subsequent annealing the material at a temperature (around 800° C.) which causes migration of the vacancy defects through the crystal lattice to pair up with native single substitutional nitrogen defects;

(iii) formation after diamond material synthesis from native nitrogen defects incorporated during the growth process by irradiating the synthetic diamond material to introduce vacancy defects and then subsequently annealing the material at a temperature which causes migration of the vacancy defects through the crystal lattice to pair up with native single substitutional nitrogen defects;

(iv) formation after diamond material synthesis by implanting nitrogen defects into the synthetic diamond material after diamond material synthesis and annealing the material at a temperature which causes migration of the native vacancy defects through the crystal lattice to pair up with implanted single substitutional nitrogen defects; and (v) formation after diamond material synthesis by irradiating the synthetic diamond material to introduce vacancy defects, implanting nitrogen defects into the synthetic diamond material, and annealing the material at a temperature which causes migration of the vacancy defects through the crystal lattice to pair up with implanted single substitutional nitrogen defects.

As described in WO 2015/071487, formation of $NV^-$ defects by nitrogen ion implantation and annealing (optionally including a vacancy generating irradiation step pre- or post-ion implantation) can be advantageous because $NV^-$ defects in synthetic diamond material used in applications such as nano-magnetometry, wide-field magnetometry, and quantum processing applications typically need to be close to the surface of the synthetic diamond material (within a few nm) and ion implantation is a useful method of providing near surface $NV^-$ defects;

A problem with the formation of near surface $NV^-$ defects in synthetic diamond materials via nitrogen ion implantation and annealing is that to date such near surface $NV^-$ defects exhibit a shorter spin coherence time than native $NV^-$ defects found in the bulk of high purity single crystal CVD diamond material such as the single crystal CVD diamond materials described in WO01/096633, WO2010/010344, and WO2010/010352.

A further problem with forming near surface $NV^-$ centres by nitrogen ion implantation is that is that the surfaces are typically not smooth, and so unsuitable for device fabrication. Surfaces can be improved by mechanical polishing but this can remove near surface $NV^-$ centres and reduce the decoherence time, $T_2$ of the $NV^-$ centres. Currently, the best solution has been to use Inductively Coupled Plasma (ICP) etching, but there is evidence that this too causes damage to the surface and the $NV^-$ centres.

SUMMARY OF THE INVENTION

It is an object of the present invention to provide a single crystal CVD diamond component with a combination of a polished surface and spin centres close to the polished surface with a high $T_2$ value, and to provide a method for producing such a diamond component.

According to a first aspect, there is provided a single crystal CVD diamond component comprising a surface, wherein at least a portion of the surface has been processed by chemical mechanical polishing, CMP, and a layer of quantum spin defects, said layer of quantum spin defects being disposed within 500 nm of the surface.

As an option, at least a portion of the surface has been further processed by inductively coupled plasma, ICP, etching.

As an option, at least a portion of the surface has been further processed by mechanical polishing.

Exemplary types of quantum spin defects are selected from any of silicon containing defects, nickel containing defects, chromium containing defects, germanium containing defects, tin containing defects, and nitrogen containing defects.

Optionally, the quantum spin defects are negatively charged nitrogen-vacancy defects, $NV^-$.

As an option, a concentration of quantum spin defects is selected from any of equal to or greater than: $1\times10^{13}$ defects/cm$^3$; $1\times10^{14}$ defects/cm$^3$; $1\times10^{15}$ defects/cm$^3$; $1\times10^{16}$ defects/cm$^3$; $1\times10^{17}$ defects/cm$^3$; and $1\times10^{18}$ defects/cm$^3$.

As a further option, a concentration of quantum spin defects is selected from any of equal to or less than: $4\times10^{18}$ defects/cm$^3$; $2\times10^{18}$ defects/cm$^3$; $1\times10^{18}$ defects/cm$^3$; $1\times10^{17}$ defects/cm$^3$; and $1\times10^{16}$ defects/cm$^3$.

Optionally, the quantum spin defects have a Hahn-echo decoherence time $T_2$ equal to or greater than 10 µs, 50 µs, 100 µs, 300 µs, 600 µs, 1 ms, 10 ms, 100 ms, or 500 ms.

As an option, the single crystal CVD diamond component surface has a surface roughness Ra of no more than 5 nm, 2 nm, 1 nm, or 0.5 nm.

The single crystal CVD diamond component optionally comprises a further layer having a single substitutional nitrogen concentration of no more than 300 ppb, 200 ppb, 100 ppb, 80 ppb, 60 ppb, 40 ppb, 20 ppb, 10 ppb, 5 ppb, or 1 ppb, said layer being disposed distal to the surface relative to the layer of quantum spin defects.

The layer of quantum spin defects is optionally disposed within 500 nm, 200 nm, 100 nm, 50 nm, 30 nm, 10 nm, or 5 nm of the surface.

The thickness of the layer of quantum spin defects is optionally no more than 200 nm, 100 nm, 50 nm, 30 nm, 10 nm or 5 nm.

As an option, the single crystal CVD diamond component has at least one lateral dimension of at least 0.5 mm, 1 mm, 2 mm, 3 mm, 4 mm, 4.5 mm, or 5 mm.

According to a second aspect, there is provided a device comprising the single crystal CVD diamond component described above in the first aspect.

According to a third aspect, there is provided a method of fabricating the single crystal CVD diamond component described above in the first aspect, the method comprising providing a single crystal CVD diamond having a surface and processing at least a portion of the surface using chemical mechanical polishing, CMP, such that the single crystal CVD diamond comprises a layer of quantum spin defects, said layer of quantum spin defects being disposed within 500 nm of the surface.

The method optionally further comprises, prior to processing at least a portion of the surface using chemical mechanical polishing, processing the portion of the surface using inductively coupled plasma, ICP, etching.

The method optionally further comprises, prior to processing at least a portion of the surface using chemical mechanical polishing, processing the portion of the surface using mechanical polishing.

In an optional embodiment, the method further comprises implanting nitrogen into the surface of the single crystal CVD diamond and annealing the single crystal CVD diamond to cause migration of vacancy and/or nitrogen defects within the single crystal CVD diamond and formation of nitrogen-vacancy defects from the implanted nitrogen and the vacancy defects, such that the implanting and annealing form the layer of quantum spin defects disposed within 500 nm of the surface. As a further option, the single crystal CVD diamond, prior to implanting and annealing, has a single substitutional nitrogen concentration of no more than 300 ppb, 200 ppb, 100 ppb, 80 ppb, 60 ppb, 40 ppb, 20 ppb, 10 ppb, 5 ppb, or 1 ppb.

In an alternative optional embodiment, the method further comprises, prior to processing at least a portion of the surface using chemical mechanical polishing, providing the single crystal CVD diamond having a quantum spin defect concentration selected from any of equal to or greater than: $1\times10^{13}$ defects/cm$^3$; $1\times10^{14}$ defects/cm$^3$; $1\times10^{15}$ defects/cm$^3$; $1\times10^{16}$ defects/cm$^3$; $1\times10^{17}$ defects/cm$^3$; and $1\times10^{18}$ defects/cm$^3$. As a further option, the method comprises, prior to processing at least a portion of the surface using chemical mechanical polishing, providing the single crystal CVD diamond having a quantum spin defect concentration selected from any of equal to or less than: $4\times10^{18}$ defects/cm$^3$; $2\times10^{18}$ defects/cm$^3$; $1\times10^{18}$ defects/cm$^3$; $1\times10^{17}$ defects/cm$^3$; and $1\times10^{16}$ defects/cm$^3$.

BRIEF DESCRIPTION OF THE DRAWINGS

The invention will now be more particularly described, by way of example only, with reference to the accompanying drawings, in which.

Throughout the description, similar parts have been assigned the same reference numerals, and a detailed description is omitted for brevity.

DETAILED DESCRIPTION

Figure 1:
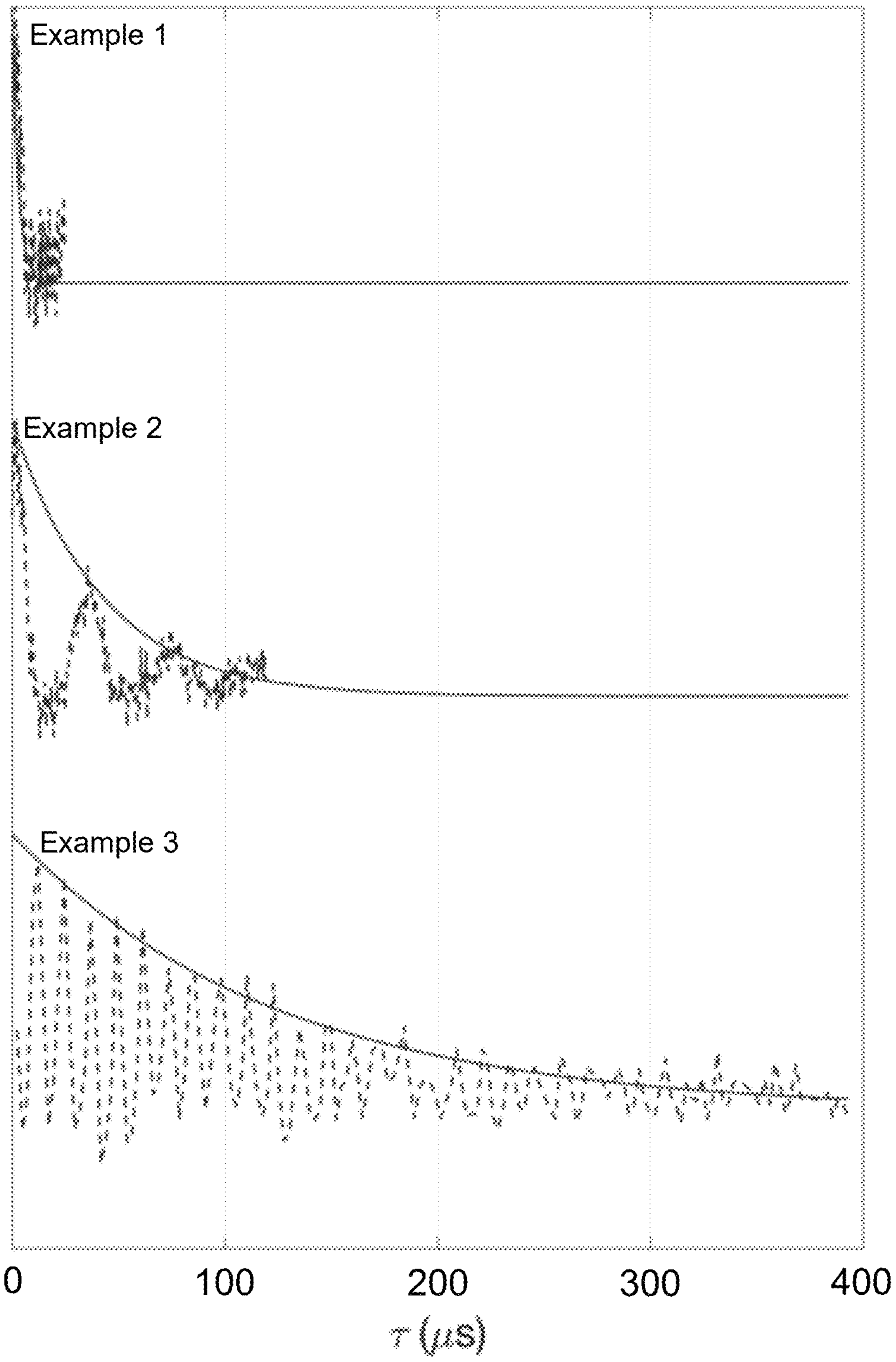
FIG. 1 is a series of graphs showing measured $T_2$ values for Examples diamond materials after different treatments.
Figure 2:
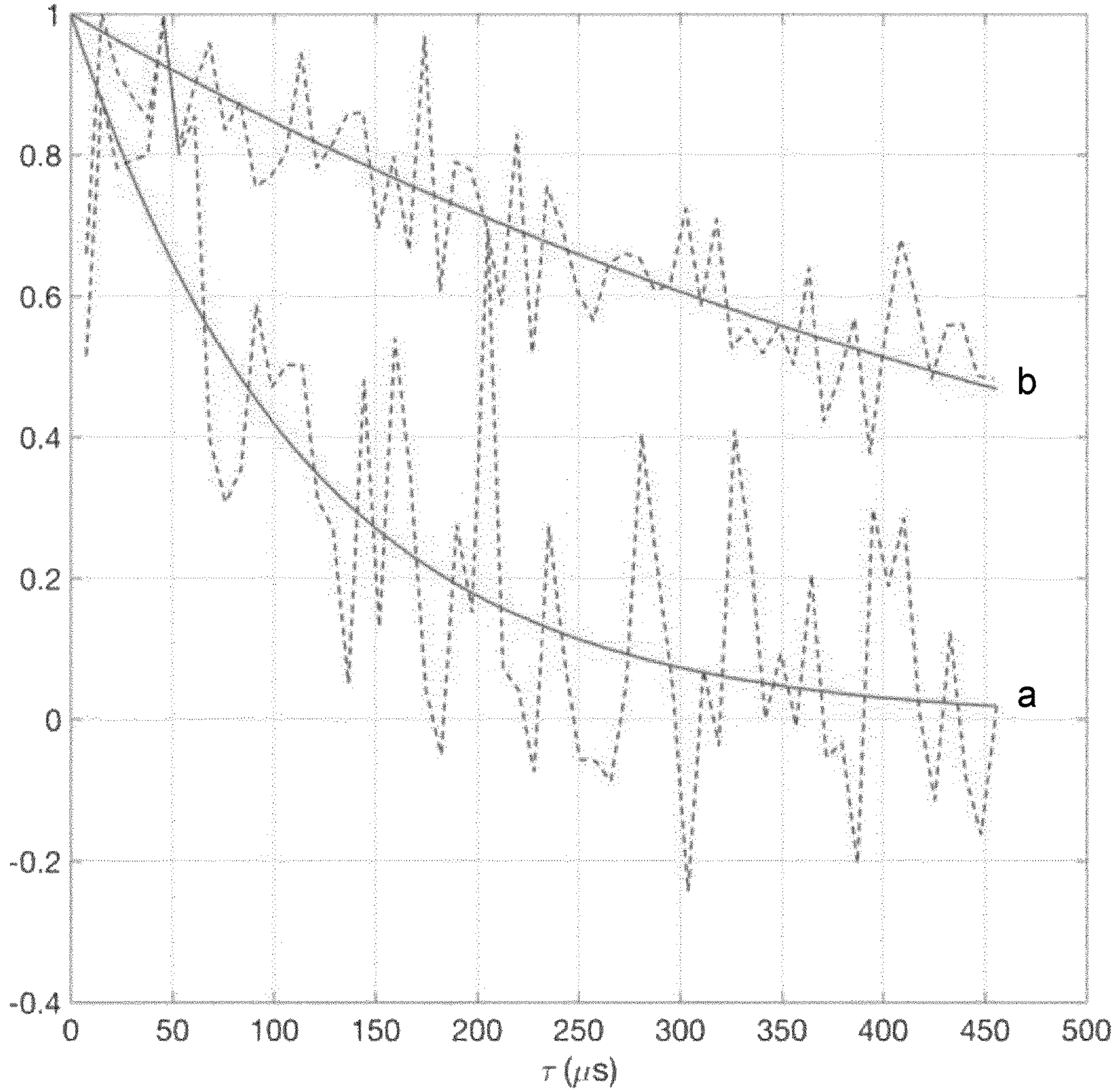
FIG. 2 is a graph showing further measured $T_2$ values.

The present inventors have determined that a diamond surface can be greatly improved with near surface quantum spin defects by a combination of mechanical polishing, followed by ICP plasma etching to remove polishing damage. Critically, a final step of Chemical Mechanical Polishing (CMP) is applied to the surface to remove etch damage and produce a high-quality finish. This may be performed on diamond that already has quantum spin defects present, or the diamond can undergo an implantation technique such as that described in WO 2015/071487 at the polished surface. This gives a significantly improved decoherence time $T_2$. A long $T_2$ (e.g. greater than 50 μs) enables high resolution sensing and control operations. The $T_2$ value decreases dramatically where mechanical surface and subsurface damage is present, and hence $T_2$ values can provide a proxy for estimating subsurface damage.

CMP is a process in which a chemical slurry is applied to a surface to alter its surface bonding via chemical techniques and therefore form a softer phase of material. The mechanical component is the application of abrasive particles, typically on a polishing wheel, to remove the softer phase of material from the surface being polished. The advantage of this technique over regular mechanical polishing is that abrasive particles that are softer than the bulk diamond can be used. This ensures that there is less surface and subsurface damage using CMP than using regular mechanical polishing.

It is advantageous to have quantum spin defects in proximity to the surface so that they are readily accessible for end applications such that they can be place in optical structures or are close to the surface for sensing applications.

Examples of quantum spin defects include silicon containing defects, nickel containing defects, chromium containing defects, germanium containing defects, tin containing defects and nitrogen containing defects. The following description focuses on the quantum spin defect being a negatively charged nitrogen-vacancy ($NV^-$) defect, but the skilled person will understand that the same techniques may be used for any type of quantum spin defect.

Example 1

A diamond sample was provided consisting of single crystal CVD diamond with a very low nitrogen concentration, as described in WO01/096633.

The diamond of example was mechanically polished using a standard polishing technique to remove a depth of 80 nm of material. The diamond subsequently underwent nitrogen ion implantation at less than 150 keV, implanting to a depth of less than 100 nm, followed by irradiation and annealing to form near-surface $NV^-$ centres. Annealing was carried out for 16 hours at 800° C., followed by 1200° C. for 2 hours, as described in WO2012/090662

Example 2

A diamond sample was mechanically polished in the same way as the diamond sample of example 1. The diamond then underwent ICP plasma etching under the conditions described in Mildren and Rabeau, Optical Engineering of Diamond, Wiley-VCH 2013 page 130 by 2 μm. The diamond subsequently underwent ion implantation followed by irradiation and annealing to form near-surface $NV^-$ centres in the same way as described in example 1.

Example 3

A diamond sample was mechanically polished and ICP etched in the same way as the diamond sample of example 2. The diamond was then further processed using CMP, using a Logitech Tribo CMP system. The diamond subsequently underwent ion implantation followed by irradiation and annealing to form near-surface $NV^-$ centres in the same way as described in example 1.

FIG. 1 is a series of graphs showing measured $T_2$ values for Examples 1 to 3. The measured $T_2$ of Example 1 was 2.7±0.4 μs, the measured $T_2$ of Example 1 was 42±5 μs, and the measured $T_2$ of Example 3 was 120±20 μs.

It can be seen that, as is known, the step of ICP etching after polishing had a significant effect on the $T_2$ value. However, it was surprising to see that the subsequent step of CMP processing had a further significant effect, increasing the value of $T_2$ by a factor of almost 3 compared to the sample that had not undergone CMP.

It was subsequently found that the equipment used imposed artificial limits on the measured $T_2$ values. As longer and longer $T_2$ values are measured, equipment stability and stray magnetic fields make the measurement more difficult. The $T_2$ value may be, for example, 1 μs, but the measurement time may be hours, such that there is interference from the environment which limits the $T_2$ values that are recorded. Example 3 was measured once again using modified equipment to take into account environmental factors. Curve (a) shows the original measured values for Example 3, curve (b) shows the measured value using the modified equipment, leading to a $T_2$ value of 550 μs. This is comparable to the values measured in WO 2015/071487 where no surface processing was applied.

Figure 3:
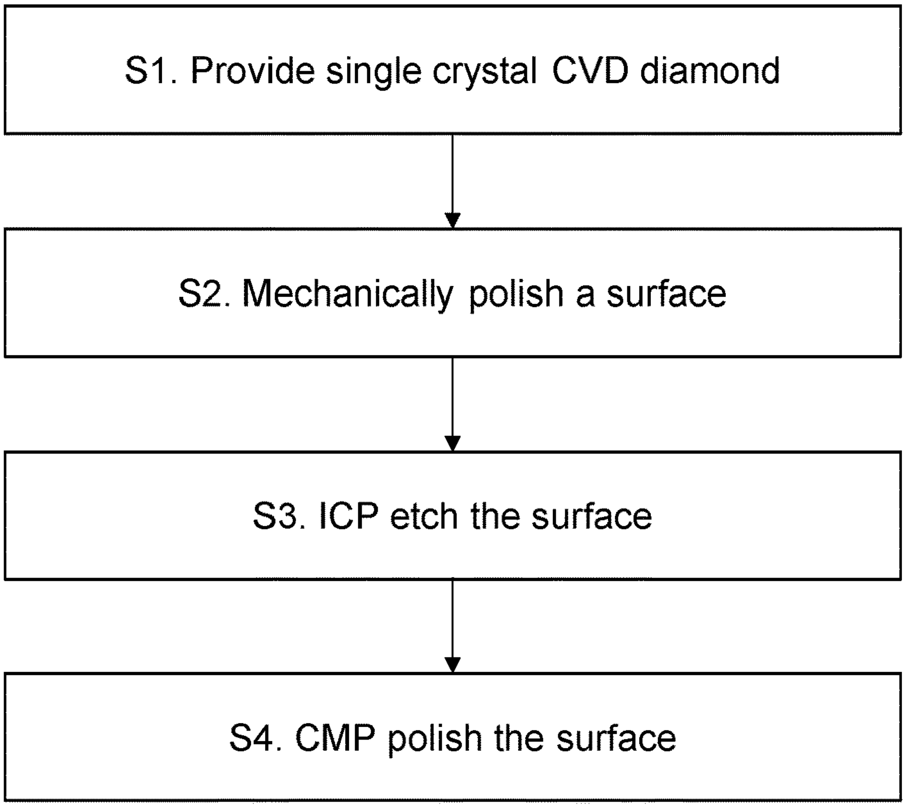
FIG. 3 is a flow diagram showing exemplary steps for processing the single crystal CVD diamond.

FIG. 3 is a flow diagram showing exemplary steps to process a diamond surface. The following numbering corresponds to that of FIG. 3:

S1. A single crystal CVD diamond having a surface is provided;

S2. In an optional step, at least a portion of the surface is mechanically polished.

S3. In an optional step, at least a portion of the surface is processed using ICP etching.

S4. At least a portion of the surface is processed using CMP such that the single crystal CVD diamond comprises a layer of quantum spin defects, said layer of quantum spin defects being disposed within 500 nm of the surface.

The techniques described above may be used on any single crystal CVD diamond that includes quantum spin defects. Alternatively, the techniques above may be used on a diamond material that has negligible quantum spin defects, and the quantum spin defects are subsequently introduced to the CMP process surface.

Figure 4:
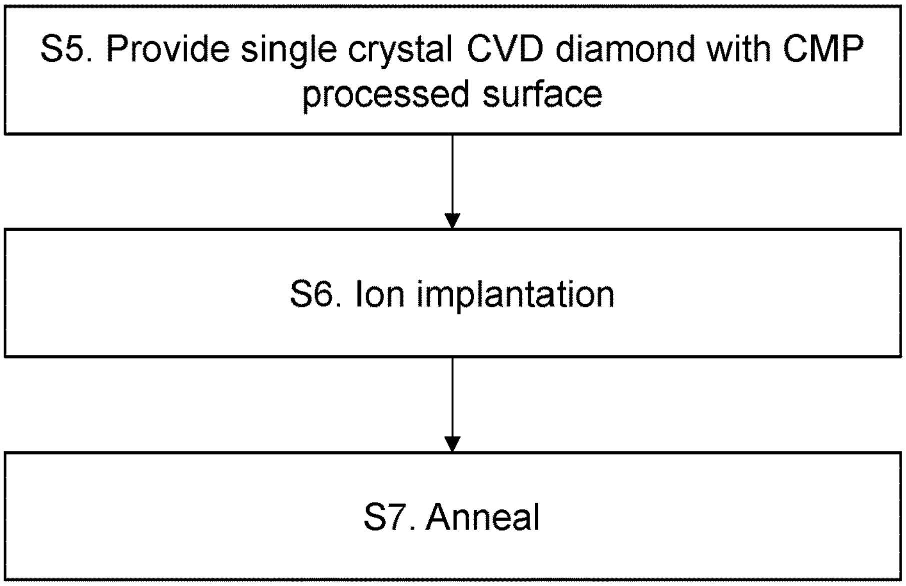
FIG. 4 is a flow diagram showing further exemplary steps for processing the single crystal CVD diamond.

FIG. 4 is a flow diagram illustrating exemplary steps for introducing quantum spin defects to a CMP processed surface. Again, this described specific techniques for forming $NV^-$ centres, but the skilled person will appreciate that similar techniques can be used to introduce other types of quantum spin defect. The following numbering corresponds to that of FIG. 4:

S5. A CVD single crystal diamond with a CMP processed surface is provided. It is desirable that CVD single crystal diamond contains a low level of nitrogen impurities to ensure that controlled levels of implanted nitrogen can be achieved. It is preferred that the CVD single crystal diamond has a single substitutional nitrogen concentration of no more than 300 ppb, 200 ppb, 100 ppb, 80 ppb, 60 ppb, 40 ppb, 20 ppb, 10 ppb, 5 ppb, or 1 ppb.

S6. Nitrogen is ion implanted nitrogen into the surface of the single crystal CVD diamond, to give a surface layer of diamond with predominantly single substitutional nitrogen defects. The implantation energy and dose can be controlled to control the depth, thickness, and concentration of nitrogen within the high purity single crystal CVD diamond plate as is known in the art. Furthermore, factors such as channelling mean that it can be desirable to control the angle of implantation with respect to the orientation of the as-grown crystal face. That is, the nitrogen may be implanted into the surface of the single crystal CVD diamond layer at an acute angle relative to the as-grown growth face.

The exact implantation depth and concentration of nitrogen will depend on the required characteristics of the diamond component in an end application. Typically, the nitrogen is implanted into the as-grown growth face of the single crystal CVD diamond layer to a depth of no more than 1 μm, 500 nm, 100 nm, 50 nm, 30 nm, 10 nm or 5 nm. Typically, the implantation dose will be at least 105 $N/cm^2$, $10^6$ $N/cm^2$, 107 $N/cm^2$, $10^8$ $N/cm^2$, 109 $N/cm^2$, $10^{10}$ $N/cm^2$, or $10^{11}$ $N/cm^2$ and/or no more than $10^{14}$ $N/cm^2$ or $10^{13}$ $N/cm^2$. In certain circumstances for reasons of yield, it can be desirable to control the temperature of the diamond material during implantation, for example by heating or cooling the sample during implantation.

S7. The single crystal CVD diamond is annealed to cause the implanted nitrogen and vacancies to migrate towards each other and form move to nitrogen-vacancy defects from the implanted nitrogen and the vacancy defects.

Note that it is not necessary to create a source of nitrogen and vacancies in the single crystal CVD diamond material at the same location as the desired end location of nitrogen-vacancy defects which are to be formed within the single crystal CVD diamond. In fact, it can be desirable to implant nitrogen and/or create vacancy defects at a location within the single crystal CVD diamond which is removed from the desired end location of nitrogen-vacancy defects which are to be formed within the single crystal CVD diamond. This is because implantation and irradiation creates damage within the diamond crystal structure which, if located near nitrogen-vacancy defects, can detrimentally affect the properties of the nitrogen-vacancy defects. Even using an annealing process to remove damage caused by implantation and irradiation some residual defects will remain which can adversely affect properties of the nitrogen-vacancy defects such as decoherence time $T_2$. For example, it can be desirable to implant nitrogen at a different location within the diamond material to that which is irradiated to form vacancy defects. The material may then be heated to cause diffusion of the vacancy defects to the implanted nitrogen defects to form nitrogen-vacancy defects while minimizing crystal damage in the region where the nitrogen-vacancy defects are formed. Furthermore, charge donor defects, such as single substitutional nitrogen, which donate charge to nitrogen-vacancy defects to form $NV^-$ defects may also be separated from nitrogen-vacancy defects within the diamond material as described in WO2012/152617.

Note also that vacancies can be introduced by irradiating the single crystal CVD diamond either before or after the ion implantation step. It is known that nitrogen-vacancy defects form at around 800° C. As such, the annealing comprises an annealing step at a temperature in a range 700 to 900° C. for at least 2 hours, 4 hours, 6 hours, or 8 hours. It has also been suggested that treatment at a higher temperature can be advantageous for removing various paramagnetic defects to increase the decoherence time of $NV^-$ spin defects. Accordingly, the annealing may comprise a further annealing step at a temperature in a range 1150° C. to 1550° C. for at least 2 hours, 4 hours, 6 hours, or 8 hours. For example, the further annealing step may be performed at a temperature of at least 1200° C., 1300° C., or 1350° C. and/or a temperature of no more than 1500° C., 1450° C., or 1400° C. In addition, prior to the aforementioned annealing steps, an initial annealing step may be performed at a temperature in a range 350° C. to 450° C. for at least 2 hours, 4 hours, 6 hours, or 8 hours.

Of course, CMP could be used on an as-grown surface, but in order to remove sufficient material to get a smooth, flat surface, the process may take many days. In many applications it is therefore optimal to remove surface material using a technique such as mechanical polishing or ICP etching, as described above, followed by CMP processing. The total depth of surface material that may be removed by the combined processing techniques may be at least 10 nm, at least 50 nm, at least 100 nm, at least 1 μm, at least 5 μm, or at least 10 μm. The advantage of finishing the process with CMP is that subsurface damage that affects the $T_2$ values of the spin defects is minimised.

While this invention has been particularly shown and described with reference to embodiments, it will be understood by those skilled in the art that various changes in form and detail may be made without departing from the scope of the invention as defined by the appending claims.

The invention claimed is:

1. A single crystal CVD diamond component comprising:

a surface, wherein at least a portion of the surface has been processed by chemical mechanical polishing, CMP;

a layer of quantum spin defects, said layer of quantum spin defects being disposed within 500 nm of the surface, wherein the chemical mechanical polishing of the surface reduces subsurface damage, which increases decoherence time, $T_2$, of the quantum spin defects; and wherein the single crystal CVD diamond component has at least one lateral dimension of at least 0.5 mm.

2. The single crystal CVD diamond component according to claim 1, wherein at least a portion of the surface has been processed by inductively coupled plasma, ICP, etching prior to the chemical mechanical polishing.

3. The single crystal CVD diamond component according to claim 1, wherein at least a portion of the surface has been processed by mechanical polishing prior to the chemical mechanical polishing.

4. The single crystal CVD diamond component according to claim 1, wherein the quantum spin defects are selected from the group consisting of:

silicon containing defects;

nickel containing defects;

chromium containing defects;
germanium containing defects;
tin containing defects;
nitrogen containing defects; and
negatively charged nitrogen-vacancy defects $NV^-$.

5. The single crystal CVD diamond component according to claim 1, wherein a concentration of quantum spin defects is equal to or greater than $1\times10^{13}$ defects/$cm^3$, and wherein the concentration of quantum spin defects is equal to or less than $4\times10^{18}$ defects/$cm^3$.

6. The single crystal CVD diamond component according to claim 5, wherein the concentration of quantum spin defects is equal to or less than $2\times10^{18}$ defects/$cm^3$.

7. The single crystal CVD diamond component according to claim 1, wherein the surface has a surface roughness Ra of no more than 5 nm.

8. The single crystal CVD diamond component according to claim 1, comprising a further layer having a single substitutional nitrogen concentration of no more than 300 ppb, said layer being disposed distal to the surface relative to the layer of quantum spin defects.

9. The single crystal CVD diamond component according to claim 1, wherein the layer of quantum spin defects is disposed within 200 nm of the surface.

10. The single crystal CVD diamond component according to claim 1, wherein the single crystal CVD diamond component has the at least one lateral dimension of at least 1 mm.

11. A device comprising the single crystal CVD diamond component according to claim 1.

12. A method of fabricating the single crystal CVD diamond component as claimed in claim 1, the method comprising:

providing a single crystal CVD diamond having a surface and at least one lateral dimension of at least 0.5 mm;
processing at least a portion of the surface using chemical mechanical polishing, CMP, such that the single crystal CVD diamond comprises a layer of quantum spin defects, said layer of quantum spin defects being disposed within 500 nm of the surface.

13. The method according to claim 12, further comprising, prior to processing at least a portion of the surface using chemical mechanical polishing, processing the portion of the surface using inductively coupled plasma, ICP, etching.

14. The method according to claim 12, further comprising:

implanting nitrogen into the surface of the single crystal CVD diamond; and
annealing the single crystal CVD diamond to cause migration of vacancy and/or nitrogen defects within the single crystal CVD diamond and formation of nitrogen-vacancy defects from the implanted nitrogen and the vacancy defects;
such that the implanting and annealing form the layer of quantum spin defects disposed within 500 nm of the surface.

15. The method according to claim 12, further comprising, prior to processing at least a portion of the surface using chemical mechanical polishing, providing the single crystal CVD diamond having a quantum spin defect concentration equal to or greater than $1\times10^{13}$ defects/$cm^3$.

16. The method according to claim 15, further comprising, prior to processing at least a portion of the surface using chemical mechanical polishing, providing the single crystal CVD diamond having the quantum spin defect concentration equal to or less than $4\times10^{18}$ defects/$cm^3$.

17. The single crystal CVD diamond component according to claim 5, wherein the concentration of quantum spin defects is equal to or greater than $1\times10^{14}$ defects/$cm^3$.

18. The single crystal CVD diamond component according to claim 1, wherein the surface has a surface roughness Ra of no more than 2 nm.

19. The single crystal CVD diamond component according to claim 8, wherein the further layer has the single substitutional nitrogen concentration of no more than 200 ppb, said layer being disposed distal to the surface relative to the layer of quantum spin defects.

20. The single crystal CVD diamond component according to claim 1, wherein the layer of quantum spin defects is disposed within 200 nm of the surface.

* * * * *